(12) United States Patent
Toong et al.

(10) Patent No.: US 11,189,593 B2
(45) Date of Patent: Nov. 30, 2021

(54) INTEGRATED DEVICE PACKAGE

(71) Applicant: Analog Devices International Unlimited Company, County Limerick (IE)

(72) Inventors: Teik Tiong Toong, Tanjung Tokong (MY); Mike J. Anderson, Campbell, CA (US)

(73) Assignee: Analog Devices International Unlimited Company, Limerick (IE)

( * ) Notice: Subject to any disclaimer, the term of this patent is extended or adjusted under 35 U.S.C. 154(b) by 23 days.

(21) Appl. No.: 16/570,488

(22) Filed: Sep. 13, 2019

(65) Prior Publication Data
US 2021/0082862 A1    Mar. 18, 2021

(51) Int. Cl.
*H01L 23/00* (2006.01)
*H01L 21/48* (2006.01)

(52) U.S. Cl.
CPC .......... *H01L 24/73* (2013.01); *H01L 21/4875* (2013.01); *H01L 24/28* (2013.01); *H01L 24/80* (2013.01)

(58) Field of Classification Search
CPC ..... H01L 24/73; H01L 21/4875; H01L 24/28; H01L 24/80

USPC .......................................................... 257/686
See application file for complete search history.

(56) References Cited

U.S. PATENT DOCUMENTS

| | | | |
|---|---|---|---|
| 7,867,806 B2 | 1/2011 | Graydon et al. | |
| 7,902,664 B2 | 3/2011 | Bang et al. | |
| 9,099,456 B2 | 8/2015 | Han | |
| 9,484,290 B2 | 11/2016 | Lee et al. | |
| 10,074,614 B2 | 9/2018 | Gong et al. | |
| 2014/0340302 A1 | 11/2014 | Sengupta et al. | |
| 2018/0315719 A1* | 11/2018 | Kim | H01L 23/642 |

FOREIGN PATENT DOCUMENTS

| | | |
|---|---|---|
| CN | 1425939 A | 6/2003 |
| KR | 10-0377472 B1 | 3/2003 |
| WO | WO 2018/063196 A1 | 4/2018 |

* cited by examiner

*Primary Examiner* — Caleen O Sullivan
(74) *Attorney, Agent, or Firm* — Knobbe, Martens, Olson & Bear LLP (57) ABSTRACT

A package is disclosed. The package can include a package substrate that has an opening, such as a through hole, extending from a top side to a bottom side opposite the top side of the package substrate. The package can also include a component at least partially disposed in the through hole. The component can be an electrical component. The component can be exposed at a bottom surface of the package. The package can include a bonding material that mechanically couples the component and the package substrate.

20 Claims, 6 Drawing Sheets

FIG.2

INTEGRATED DEVICE PACKAGE

BACKGROUND

Field

The field relates to integrated device packages, and in particular, to integrated device packages with a reduced thickness.

Description of the Related Art

An integrated device package can include a plurality of components (e.g., integrated device dies and passive components such as inductors, resistors, capacitors, etc.). The components are typically mounted on a package substrate. The package substrate can in turn be mounted to a system board. In some packages, it can be important to provide a thin profile, so as to enable the packages to fit within small form-factor electronic devices and systems.

SUMMARY

In one aspect, a package is disclosed. The package includes a package substrate that has a through hole extending from a top side to a bottom side that is opposite the top side of the package substrate. The package also includes a component that is at least partially disposed in the through hole and exposed at a bottom surface of the package. The package further includes a bonding material that mechanically couples the component and the package substrate.

In one embodiment, the bonding material includes a molding material that extends between a portion of a side surface of the component and a side wall of the through hole of the package substrate. The molding material can be applied over a top surface of the component and a top surface of an integrated circuit that is mounted to the package substrate. The top surface of the component is opposite a bottom surface of the component that is exposed at the bottom surface of the package.

In one embodiment, the bottom side of the package substrate and a bottom surface of the component at least partially define the bottom surface of the package. The bottom side of the package substrate, the bottom surface of the component, and a bottom surface of the bonding material can be coplanar to each other at the bottom surface of the package.

In one embodiment, the component is an electrical component. The electrical component can include a terminal that is exposed on the bottom surface of the package. The electrical component can include a passive device. The electrical component can include an inductor. The electrical component can include an integrated device package. The electrical component can be wire bonded to the package substrate. The electrical component can include a heat sink.

In one embodiment, the package can further include a second component mounted to the top side of the package substrate. The bottom side of the package substrate can include a pad that is electrically connected to the second component by way of internal traces in the package substrate. A thickness of the component can be greater than a thickness of the second component. The bonding material can be disposed over the component or the second component.

In one embodiment, the package substrate can include a printed circuit board.

In one aspect, a package is disclosed. The package includes a package substrate that has a top side and a bottom side that is opposite the top side. The top side of the package substrate includes a first portion and a second portion. The second portion includes an opening in the package substrate. The package also includes an integrated circuit that is mounted over the first portion of the package substrate, and a component that is disposed in the second portion of the package substrate. A bottom side of the component is below the top side of the package substrate. The package further includes a molding compound that is at least partially disposed over the top side of the package substrate. The integrated circuit and the component are embedded in the molding compound. A thickness of the component is greater than a thickness of the first component, and a top side of the component is above the top side of the package substrate.

In one embodiment, the component includes an inductor.

In one embodiment, the bonding material is in contact with the top side of the package substrate and disposed over the integrated circuit and the component.

In one embodiment, the opening comprises a through hole that extends from the top side of the package substrate through the bottom side of the package substrate. The bottom side of the first component, the bottom side of the package substrate, and a bottom side of the bonding material can be coplanar at a bottom surface of the package.

In one embodiment, the opening includes a recessed portion that partially extends through the package substrate from the top side of the package substrate.

In one embodiment, the package is configured to handle a current range defined by a minimum current value and a maximum current value, the current range includes 10 A.

In one aspect, a package is disclosed. The package includes a package substrate that has a top side and a bottom side that is opposite the top side. The package also includes an integrated device that is mounted over the top side of the package substrate, and a component that has a top side and a bottom side. The package also includes means for positioning the bottom side of the component below the top side of the package substrate. The package further includes a molding compound that mechanically couples the component and the package substrate. The molding compound is disposed over the top side of the package substrate and at least partially embedding the component. A thickness of the component is greater than a thickness of the integrate device.

In one embodiment, the means for positioning includes a through hole that extends through the package substrate. The component can be at least partially disposed in the through hole.

In one embodiment, the means for positioning includes a recessed portion. The component can be mounted on the recessed portion of the package substrate.

BRIEF DESCRIPTION OF THE DRAWINGS

Embodiments of this disclosure will now be described, by way of non-limiting example, with reference to the accompanying drawings.

DETAILED DESCRIPTION

With the miniaturization of electronic devices, there is a strong demand for reducing a size of integrated device packages used in such electronic devices. Various embodiments disclosed herein relate to integrated device packages with a reduced thickness or low profile. An integrated device package can include a plurality of components. For example, an integrated device package can include a first component and a second component that has a height that is greater than a height of the first component. Depending on the particular package arrangement, the height of the integrated device package can be defined by at least one of a thickness of the package substrate, thickness(es) of the component(s) mounted to the package substrate, and a thickness of a molding compound or encapsulant. When designing the integrated device package, a thickness or height of the integrated device package can be driven by the thickest or tallest component among the plurality of components within the package.

One way to reduce the thickness of the integrated device package is to replace the thickest component with a thinner component. However, using such thinner component may not provide a desired thickness of the integrated device package, or such thinner components may be unavailable for a particular type of package.

Various embodiments disclosed herein reduce the thickness of an integrated device package by accommodating a height difference between the first component and the second component. In some embodiments, this can be achieved by having an opening at a portion of a substrate in the integrated device package, in order to lower a bottom surface of the thickest component relative to the top surface of the package substrate.

A package according to various embodiments disclosed herein can include a package substrate, a first component mounted on the substrate, and a second component that has a height that is greater than a height of the first component. The first and second components can comprise electrical components. The first and second components can comprise any suitable type of components. For example, the first and second components can comprise any one of integrated device(s), integrated device die(s) (such as process dies, memory dies, microelectromechanical systems (MEMS) dies, sensor dies, optical dies, etc.), integrated circuit(s), passive electronic components (e.g., resistors, capacitors, inductors, etc.), a heat sink or heat slug, an integrated device package, or any other suitable type of device or component.

The package substrate can comprise any suitable type of package substrate. For example, the package substrate can comprise a laminate substrate (such as a printed circuit board, or PCB), a ceramic substrate, a leadframe substrate, etc. The package substrate can have an opening defined at a portion of the substrate. In some embodiments, the opening can comprise a recess. In such embodiments, the opening can extend partially through the substrate from a top surface of the package substrate. The second component can be mounted on a recessed portion of the package substrate, e.g., on an upper surface of the recess. In some embodiments, the opening can comprise a through hole. In such embodiments, the opening can extend through the substrate from the top surface of the substrate to a bottom surface of the substrate opposite the top surface. At least a portion of the second component can be disposed within the through hole. In some embodiments, the opening can be any suitable structure that lowers the bottom surface of the second component relative to the top surface of the substrate. The second component and the package substrate can be mechanically coupled by a bonding material (e.g., molding material) that is overmolded or applied over at least one of the first component, the second component, and the package substrate.

Figure 1A:
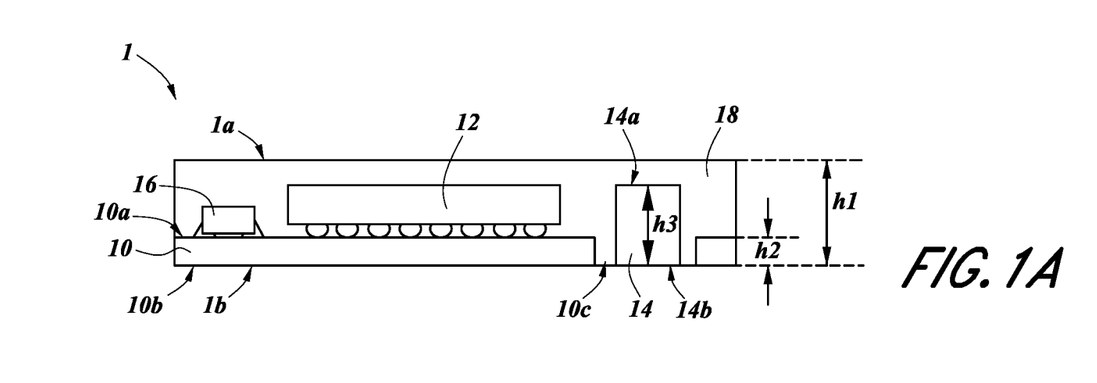
FIG. 1A is a schematic side cross-sectional view of an integrated device package according to one embodiment.
Figure 1B:
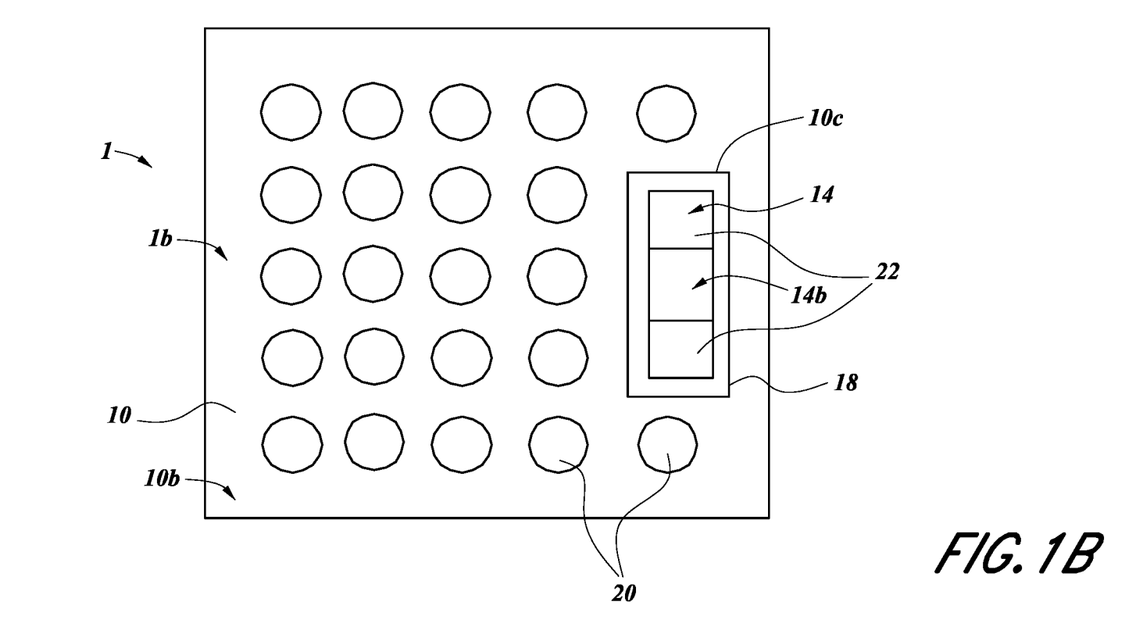
FIG. 1B is a schematic bottom plan view of the package illustrated in FIG. 1A.

FIG. 1A is a schematic side cross-sectional view of a package 1 according to one embodiment. FIG. 1B is a schematic bottom plan view of the package 1 illustrated in FIG. 1A. The package 1 can include a package substrate 10 having a top side 10a, a bottom side 10b, and an opening (e.g., through hole 10c), a first component 12 mounted on the top side 10a of the package substrate 10, a second component 14 disposed at least partially in the through hole 10c, and a third electronic component 16 mounted on the top side 10a of the package substrate 10.

As shown in FIG. 1A, the first component 12 can be flip chip mounted to the top side 10a of the package substrate 10 by way of a plurality of solder balls. In other embodiments, the first component 12 can be mounted to the package substrate 10 with an adhesive, and can electrically connect to the package substrate 10 with wire bonds. In the illustrated embodiment, the first component 12 comprises an integrated device die, but in other embodiments, the first component 12 can comprise any other suitable type of component. The third component 16 can be adhered to the top side 10a of the package substrate 10 with a suitable adhesive. In the illustrated embodiment, the third component 16 comprises a passive component (e.g., a capacitor), but in other embodiments, the third component 16 can comprise any suitable type of electronic component.

In various embodiments, the top side 10a of the package substrate 10 can comprise a top surface of the package substrate 10, and the bottom side 10b of the package substrate 10 can comprise a bottom surface of the substrate 10. The package 1 can have a top side 1a and a bottom side 1b. In the illustrated embodiment, the bottom side 10b of the package substrate 10 can define and/or be flush with the bottom side 1b of the package 1. The second component 14 has a height h3 that is greater than a height of at least one of the first component 12 and the third component 16. The height h3 can be greater than a height h2 of the package substrate 10. In some embodiments, the second component 14 can be the tallest component included in the package 1. For example, in some embodiments, the second component 14 can comprise an inductor that is thicker or taller than the other components in the package 1. The second component 14 can comprise other suitable components, such as capacitors, resistors, integrated device dies, etc., as explained herein.

The package 1 can also include a bonding material (e.g., a molding compound or material 18) that mechanically couples the second component 14 to the package substrate 10. For example, as shown in FIG. 1A, the package substrate 10 and the second component 14 can be at least partially embedded within the molding compound 18, such that the molding compound 18 mechanically couples the second component 14 with the package substrate 10, e.g., by way of portions of the molding compound 18 disposed within the through hole 10c between the second component 14 and the edges of the hole 10c in the substrate 10. The molding material 18 can comprise a non-conductive material. As illustrated in FIG. 1A, the molding compound 18 can be at least partially disposed or extending between a portion a side surface of the second component 14 and a wall of the through hole 10c. The molding material 18 can be applied over the first, second, and/or third components 12, 14, 16.

The package substrate 10 of the package 1 illustrated in FIG. 1A comprises only one opening (e.g., the through hole 10c). However, in some other embodiments, the package substrate 10 can comprise a plurality of openings. FIG. 1A illustrates the through hole 10c being located near an edge of the package substrate 10. However, the through hole 10c can be defined in any suitable location of the substrate 10.

The first component 12, the second component 14 and the third component 16 can comprise any suitable electrical component and/or non-electrical component. For example, the first component 12, the second component 14 and the third component 16 can comprise an integrated device die, a chip capacitor, an inductor, a capacitor, a heat sink, a device package etc. For example, in the illustrated embodiment, the first component 12 comprises a die that is flip-chip mounted to the top side 10a of the package substrate 10, and the third component 16 comprises a chip capacitor mounted to the top side 10a of the package substrate 10 by way of a solder print. However, the first component 12 and the third component 16 can be mounted to the package substrate 10 by any suitable manner.

The second component 14 has a top side 14a and a bottom side 14b. In various embodiments, the top side 14a of the second component 14 can comprise a top surface of the second component, and the bottom side 14b of the second component 14 can comprise a bottom surface of the second component 14. The bottom side 14b of the second component 14 can be flush or coplanar with the bottom side 10b of the package substrate 10, thereby defining a portion of the bottom side of the package 1. As illustrated in FIG. 1A, the second component 14 and the package substrate 10 can be spaced apart and mechanically coupled by the molding material 18. However, in some embodiments, the second component 14 can physically contact the package substrate 10. In some embodiments, the bonding material (e.g., the molding material 18, an adhesive, a glue, etc.) may be applied only partially between the second component 14 and the package substrate 10.

The opening can serve to lower the bottom side 14b of the second component 14 relative to the top side 10a of the package substrate 10 and/or a bottom side 12b of the first component 12. The top side 14b of the second component 14 can be above the top side 10a of the package substrate 10 and/or the bottom side 12b of the first component 12. The opening which lowers the bottom side 14b of the second component 14 can include, for example, a recess, a cavity, a void, a crater, a well, a groove, a trench, a pocket, or the through hole 10c, or any combination thereof.

The package 1 has a height h1. Reducing the height h1 of the package 1 can, for example, allow a size of an electronic device that incorporates the package 1 to be reduced. For a conventional package, a height of the package is defined at least in part by a height of its substrate, a height of the tallest component mounted to the substrate, and a thickness of any molding compound that extends above the tallest component. On the other hand, by incorporating the though hole 10c into the package substrate 10 of the package 1, the height h1 of the package 1 can be shorter than the sum of a height h2 of the package substrate 10 and a height h3 of the second component 14. That is, the height h1 of the package can be reduced by a depth or height of the opening (e.g., the through hole 10c), which in the embodiment of FIG. 1A is equal to the thickness of the package substrate h2.

In certain applications, the height h1 of the package 1 can be in a range from 1 mm to 1.5 mm, and the height h2 of the package substrate 10 can be in a range from 0.1 mm to 0.5 mm. In some embodiments, the package 1 can be configured for high power applications. In some embodiments, the package 1 can be configured to handle current up to about 10 A. For example, the package 1 can be configured to handle current in a range from at least about 5 A to about 10 A. For example, the package 1 can handle a current range defined by a minimum current value and a maximum current value, where the current range includes 10 A. In some embodiments, the through hole 10c allows the tallest component within the package 1 to have a height that is as tall as the height h1 of the package 1.

As illustrated in FIG. 1B, the bottom side 10b of the package substrate 10 can have a plurality of conductive pads 20 in electrical communication with the first and third components 12, 16 by way of internal traces or conductors of the package substrate 10. The conductive pads 20 can provide electrical connections between the first component 12 and/or the third component 16 to an external substrate (e.g., a PCB, etc.) or an external device (not illustrated). The bottom side 10b of the substrate 10 can have any suitable number of pads. In some embodiments, the pads can comprise ball grid array (BGA) pads, land grid array (LGA) pads, etc.

In the package 1 illustrated in FIGS. 1A and 1B, the bottom side 14b of the second component 14 can be exposed at the bottom side 1b of the package 1. The bottom side 14b of the second component 14 can have one or a plurality of terminals 22 that can connect to the external substrate (e.g., a PCB, etc.) or the external device. Thus, unlike the first and third components 12, 16, which connect to the external substrate or device through the package substrate 10, the second component 14 can directly connect to the external substrate or device without being electrically connected to the package substrate 10. For example, in some embodiments, the conductive pads 20 of the package substrate 10 and the terminal(s) 22 of the second component 14 can electrically and mechanically connect to the external device or substrate, for example, by way of solder balls or other conductive interconnections.

Figure 2:
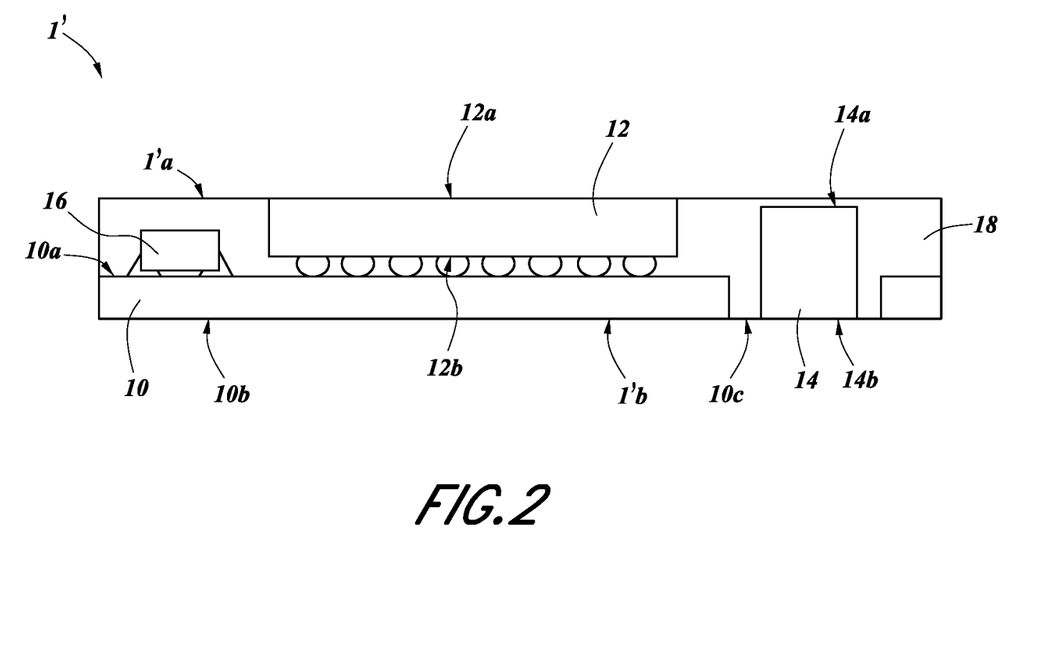
FIG. 2 is a schematic side cross-sectional view of an integrated device package according to another embodiment.

FIG. 2 is a schematic side cross-sectional view of a package 1' according to another embodiment. The package 1' is generally similar to the package 1 illustrated in FIGS. 1A and 1B, except that in FIG. 2, a top side 12a of the first component 12 is exposed on and/or flush with a top side 1'a of the package 1'. In the illustrated embodiment, the top side 12a of the first component 12 is at the highest position among the components included in the package 1'. In some other embodiments, a top side of the second component 14 or the third component 16 can be positioned higher than the other components and be exposed on the top side 1'a of the package 1'. In the arrangement of FIGS. 1A-1B, a portion of the molding compound 18 extends above the top sides of the components 12, 14, 16. To further reduce the thickness or height of the integrated device package, the portion of the molding compound 18 extending above the tallest component 12 can be removed, for example, by grinding. The overall height of the package 1' can accordingly be reduced.

Figure 3A:
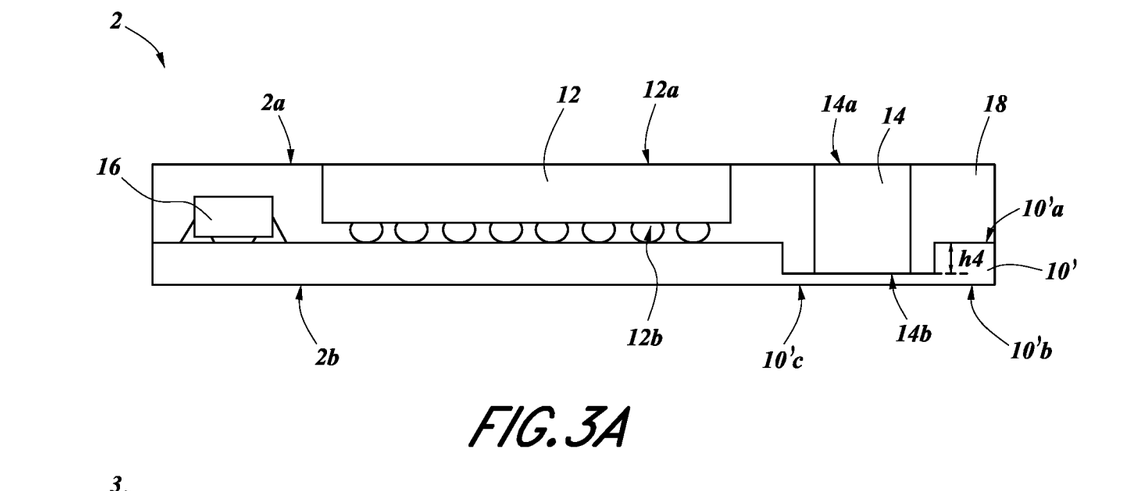
FIG. 3A is a schematic side cross-sectional view of an integrated device package according to another embodiment.

FIG. 3A is a schematic side cross-sectional view of a package 2 according to another embodiment. The package 2 is generally similar to the packages 1, 1' illustrated in FIGS. 1A and 1B, except that the opening of the package substrate 10' of the package 2 comprises a recessed portion 10'c instead of the through hole 10c. The recessed portion 10'c of the package substrate 10' is defined at least in part by a recess that partially extends through the package substrate 10 from a top side 10'a of the substrate 10'. In various embodiments, the recessed portion 10'c can be formed by etching, drilling, or any other suitable material removal process.

The top side 12a of the first component 12 and the top side 14a of the second component 14 can be exposed on the top side 2a of the package 2, in the illustrated embodiment. However, in some embodiments, any one or more of the components included in the package 2 can be exposed on the top side 2a of the package 2. In some other embodiments, all the components, such as the first, second, and third components 12, 14, 16, included in the package 2 can be partially or fully embedded in the molding material 18.

The recessed portion 10'c has a height h4. The height h4 of the recessed portion 10'c can be selected based at least in part on the position of the top side 12a of the first component 12. For example, when the top side 14a of the second component 14 (e.g., the tallest component) without the recess is above the top side 12a of the first component 12 (e.g., the second tallest component) by x mm, the height h4 can be approximately x mm in order to lower the top side 14a of the second component 14 to be level or flush with the top side 12a of the first component 12. In some embodiments, the height h4 of the recessed portion 10'c can be in a range from 50% to 90% of the height h2 of the package substrate 10'.

Figure 3B:
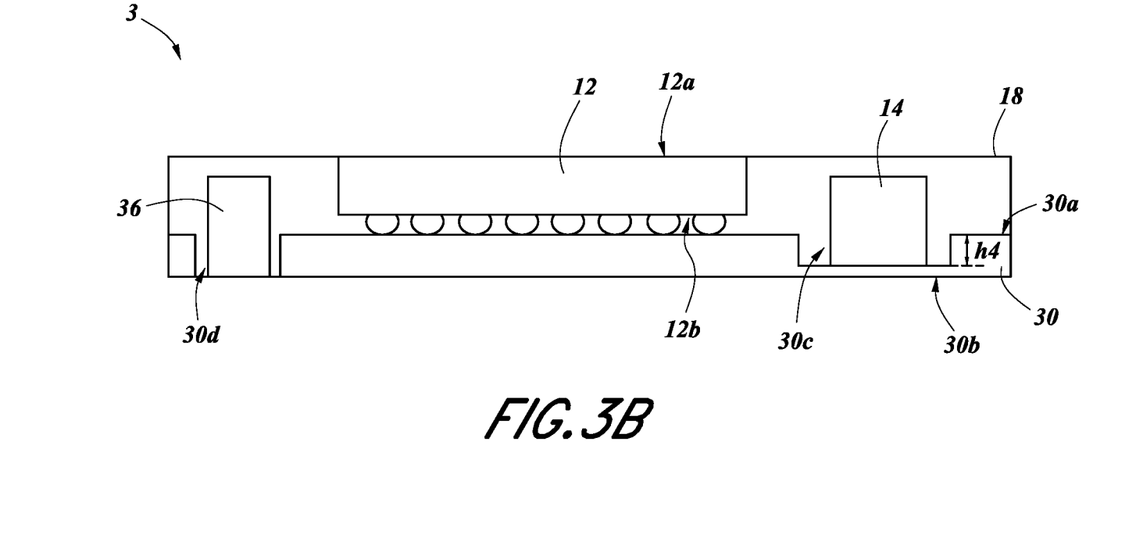
FIG. 3B is a schematic side cross-sectional view of an integrated device package according to another embodiment.

Unlike the embodiments of FIGS. 1A-2, in which the second component 14 directly electrically connects to the external device or substrate, in the embodiment of FIG. 3A, the second component 14 can be electrically connected to the package substrate 10. In some embodiments, an electrical connection can be provided between the bottom side 14b of the second component 14 and the package substrate 10, for example, by way of a flip chip connection and intervening solder balls. In some embodiments, the electrical connection can be provided between the top side 14a of the second component 14 and the package substrate 10, for example, by way of bonding wires. In the embodiment of FIG. 3B, the package substrate 10' can route electrical signals to the external device or substrate from the first, second, and third components, 12, 14, 16.

FIG. 3B is a schematic side cross-sectional view of a package 3 according to one embodiment. The package 3 can include a substrate 30 that has a top side 30a, a bottom side 30b, a first opening comprising a recessed portion 30c, and a second opening comprising a through hole 30d. The package 3 can also include a first component 12 mounted on the top side 30a of the substrate 30, a second component 14 mounted to the recessed portion 30c of the substrate 30, and a third component 36 at least partially disposed in the through hole 30d of the substrate 30. A molding material 18 can be disposed at least between the third die 36 and the substrate 30. In FIG. 3B, the molding material 18 is provided between the components 12, 14, 36, and over the second component 14 and the third component 36.

The recessed portion 30c of the substrate 30 can be the same or generally similar to the recessed portion 10'c of the package substrate 10' illustrated in FIG. 3A. Similarly, the through hole 30d of the substrate 30 can be the same or generally similar to the through hole 10c of the package substrate 10 illustrated in FIGS. 1A, 1B, and 2. Any suitable number and combination of through holes and recessed portions can be provided in the package substrate to accommodate the heights of the various components.

Figure 4A:
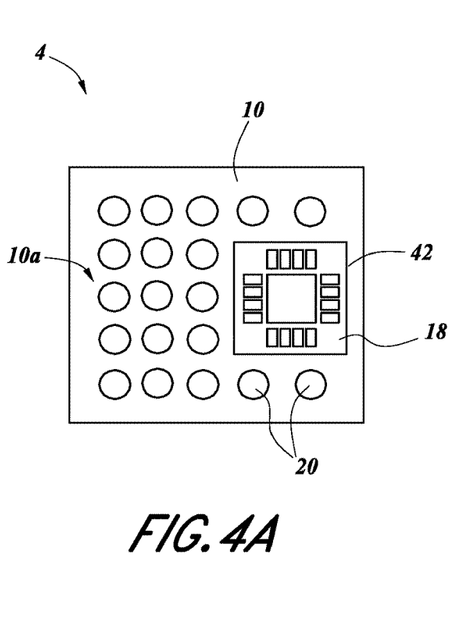
FIG. 4A illustrates a schematic bottom plan view of a package that includes a quad flat no-leads (QFN) package exposed on the bottom side of the package according to one embodiment.
Figure 4B:
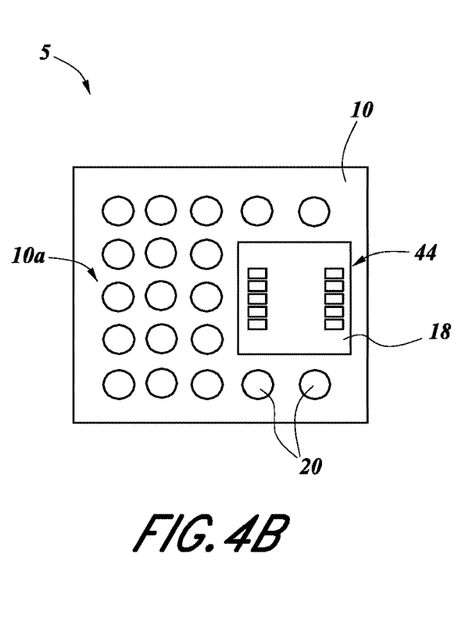
FIG. 4B illustrates a schematic bottom plan view of a package that includes a small outlet package (SOP) exposed on the bottom side of the package according to one embodiment.
Figure 4C:
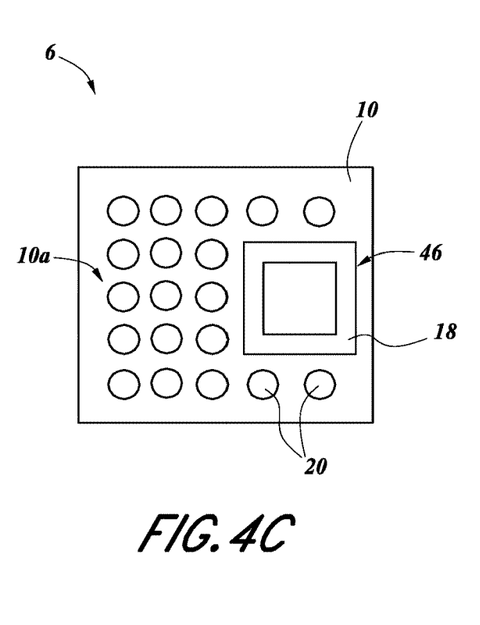
FIG. 4C illustrates a schematic bottom plan view of a package that includes a heat slug or a heat sink exposed on the bottom side of the package according to one embodiment.

FIGS. 4A to 4C illustrate schematic bottom plan views of packages 4, 5, 6 according to various embodiments. FIGS. 4A to 4C are generally similar to the bottom view of the package 1 illustrated in FIG. 1B, except that components exposed to the bottom side of the packages 4, 5, 6 represent different types or arrangements of exposed components. For example, in FIGS. 1A-3B, the second component 14 comprises an electronic component such as a passive component or die. In the embodiments of FIGS. 4A-4C, the second component 14 can comprise another package or a heat sink.

For example, FIG. 4A illustrates a quad flat no-leads (QFN) package 42 exposed on the bottom side of the package 4. FIG. 4B illustrates a small outlet package (SOP) 44 exposed on the bottom side of the package 5. The exposed component, in some embodiments, can include any other type of device packages. FIG. 4C illustrates a heat slug or a heat sink 46 exposed on the bottom side of the package 6. The heat sink 46 can comprise copper, in some embodiments. In some embodiments, the back side of an integrated device die can be exposed on the bottom side of the packages. Accordingly, as shown in FIGS. 4A-4C, any suitable type of component can be exposed through the opening of the package substrate.

FIGS. 5A-5F illustrate schematic side cross-sections showing a process flow of manufacturing the package 1' illustrated in FIG. 2. Though the process flow is specific to the package 1', similar processes can be used to manufacture any other embodiments of the package disclosed herein.

Figures 5A, 5B:
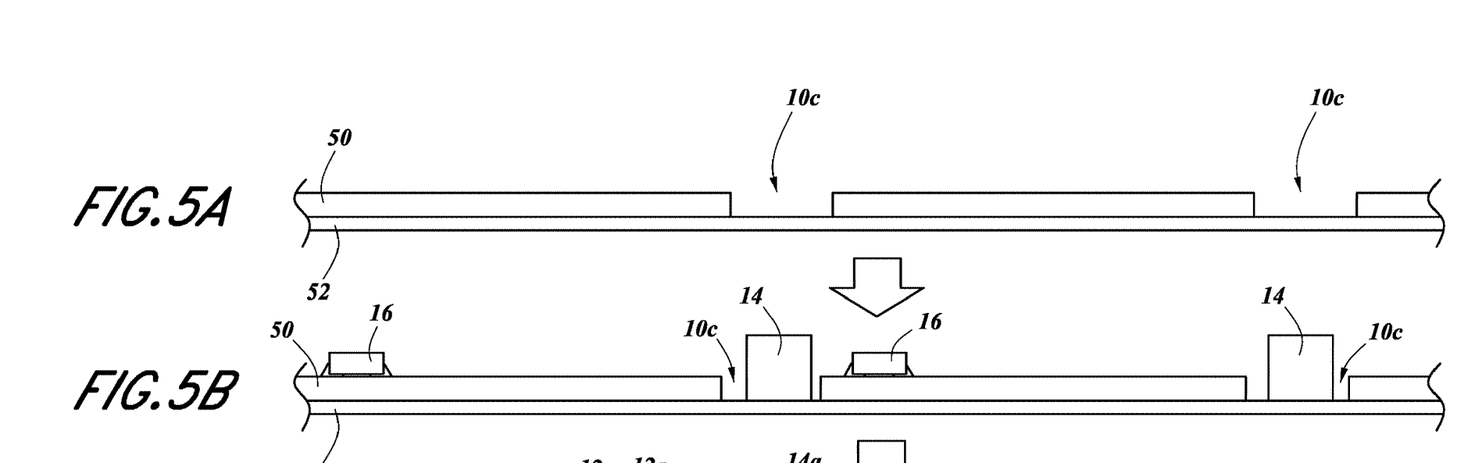
FIG. 5A illustrates a schematic side cross-section showing a step in a process flow of manufacturing an integrated device package according to one embodiment.
FIG. 5B illustrates a schematic side cross-section showing another step in the process flow of manufacturing the package according to one embodiment.

FIG. 5A illustrates a substrate layer 50 on a supporting layer (e.g., a tape 52). In some embodiments, the substrate layer 50 can comprise an undiced wafer that is attached to the tape 52. In other embodiments, the substrate layer 50 can comprise a plurality of diced package substrates that are placed and attached to the tape 52. The substrate layer 50 includes openings that comprise through holes 10c. In other embodiments, as explained above in connection with FIGS. 3A-3B, the openings can comprise recessed portions. The openings can be formed in any suitable manner, for example, by etching, drilling (e.g., laser drilling), or other material removal processes. The tape 52 can comprise, for example, a QFN tape. However, the supporting layer can comprise any suitable material that can support the substrate layer 50.

Figure 5C:
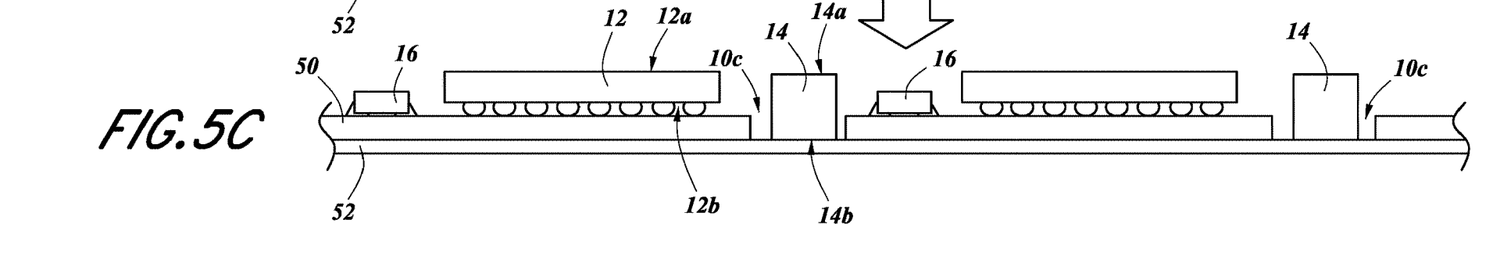
FIG. 5C illustrates a schematic side cross-section showing another step in the process flow of manufacturing the package according to one embodiment.

In FIGS. 5B and 5C, the first component 12, the second component 14, and the third component 16 are provided. The first component 12 can be flip chip mounted to the substrate layer 50 by way of a plurality of conductive interconnects, e.g., solder balls. The third component 16 can be mounted to the substrate layer 50 by way of a suitable adhesive, such as a solder print. The first component 12 and the third component 16 can be mounted to the substrate layer 50 in any suitable manner.

The second component 14 can be placed in the opening, e.g., in the through hole 10c and attached to the tape 52. In some embodiments, it may be important to precisely position the second component 14 relative to the substrate layer 50. In some embodiments, a manufacturing tolerance for positioning the second component 14 can be in a range from 80 μm to 100 μm.

Figures 5D, 5E:
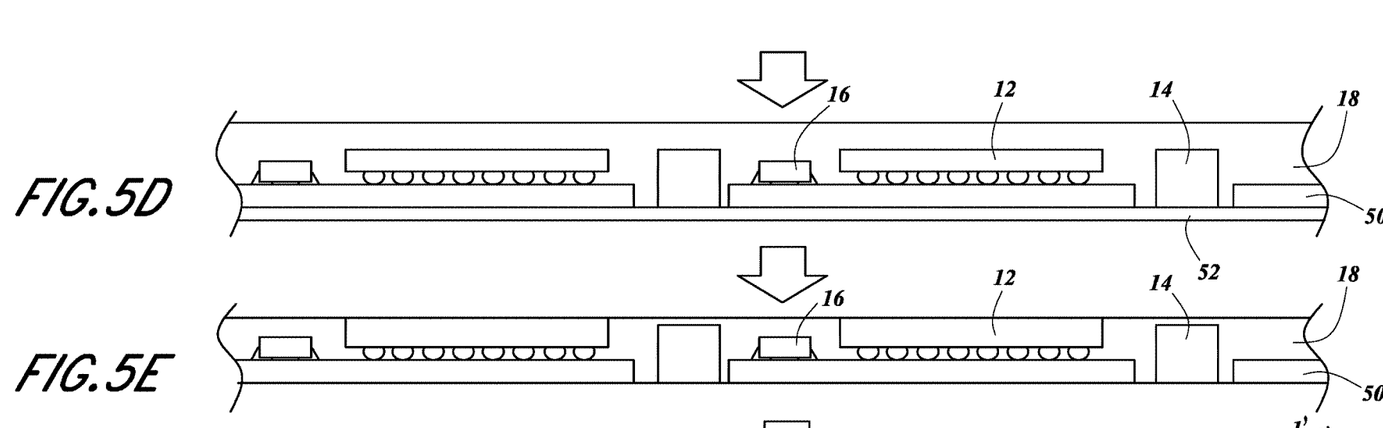
FIG. 5D illustrates a schematic side cross-section showing another step in the process flow of manufacturing the package according to one embodiment.
FIG. 5E illustrates a schematic side cross-section showing another step in the process flow of manufacturing the package according to one embodiment.

FIG. 5D illustrates a molding material 18 applied over the substrate layer 50, the first, second, and third components 12, 14, 16. In some embodiments, the molding material 18 can be disposed laterally between the second component 14 and the substrate layer 50. In some embodiments, any other bonding material can be disposed between the second component 14 and the substrate layer 50 to mechanically couple the second component 14 to the substrate layer 50. In some embodiments, a glue can be disposed between the second component 14 and the substrate layer 50. There may be more than one bonding material provided over the substrate layer 50, the first, second, and third components 12, 14, 16, in some embodiments.

Figure 5F:
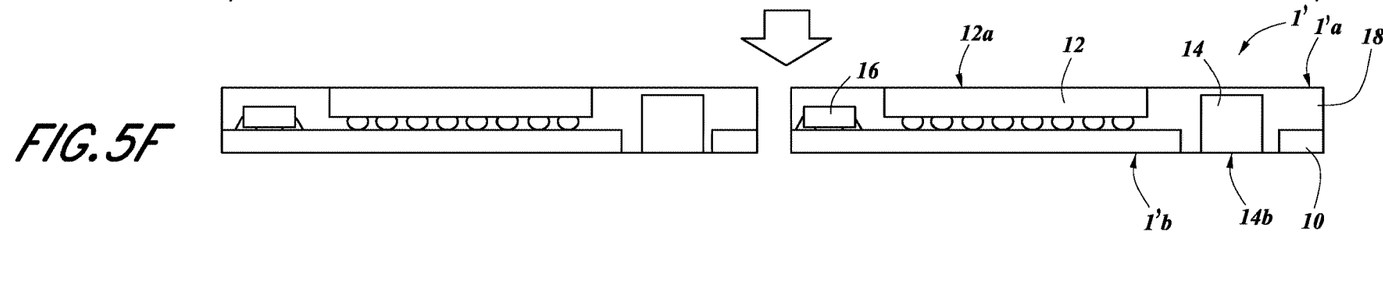
FIG. 5F illustrates a schematic side cross-section showing another step in the process flow of manufacturing the package according to one embodiment.

In FIG. 5E, the molding material 18 is partially removed or thinned, and the tape 52 is removed from the substrate layer 50. For example, the molding material 18 can be thinned by way of grinding. In FIG. 5F illustrates the packages 1' after singulation. As discussed above with respect to FIG. 2, the top side 12a of the first component 12 can be exposed on the top side 1'a of the package 1' and the bottom side 14b of the second component 14 can be exposed on the bottom side 1'b of the package 1'.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. A package comprising
   a package substrate having a through hole extending from a top side to a bottom side opposite the top side of the package substrate;
   a component at least partially disposed in the through hole and exposed at a bottom surface of the package, the component has a thickness that is greater than a thickness of the package substrate; and
   a bonding material that mechanically couples the component and the package substrate.

2. The package of claim 1, wherein the bonding material comprises a molding material extending between a portion of a side surface of the component and a side wall of the through hole of the package substrate.

3. The package of claim 2, wherein the molding material is applied over a top surface of the component and a top surface of an integrated circuit mounted to the package substrate, the top surface of the component being opposite a bottom surface of the component that is exposed at the bottom surface of the package.

4. The package of claim 1, wherein the bottom side of the package substrate and a bottom surface of the component at least partially define the bottom surface of the package, wherein the bottom side of the package substrate, the bottom surface of the component, and a bottom surface of the bonding material are coplanar to each other at the bottom surface of the package.

5. The package of claim 1, wherein the component comprises an electrical component.

6. The package of claim 5, wherein the electrical component includes a terminal exposed on the bottom surface of the package.

7. The package of claim 5, wherein the electrical component comprises a passive device, the passive device comprises an inductor.

8. The package of claim 5, wherein the electrical component comprises an integrated device package.

9. The package of claim 5, wherein the electrical component comprises a heat sink.

10. The package of claim 1, further comprising a second component mounted to the top side of the package substrate, wherein the bottom side of the package substrate comprises a pad electrically connected to the second component by way of internal traces in the package substrate.

11. The package of claim 1, wherein the package substrate comprises a printed circuit board.

12. A package comprising:
   a package substrate having a top side and a bottom side opposite the top side, the top side of the package substrate comprises a first portion and a second portion, the second portion comprising an opening in the package substrate;
   an integrated circuit mounted over the first portion of the package substrate;
   a component disposed in the second portion of the package substrate, a bottom side of the component being below the top side of the package substrate; and
   a molding compound at least partially disposed over the top side of the package substrate and embedding the integrated circuit and the component,
   wherein a thickness of the component is greater than a thickness of the integrated circuit and a top side of the component is above the top side of the package substrate.

13. The package of claim 12, wherein the component comprises an inductor.

14. The package of claim 12, wherein the bonding material is in contact with the top side of the package substrate and disposed over the integrated circuit and the component.

15. The package of claim 12, wherein the opening comprises a through hole that extends from the top side of the package substrate through the bottom side of the package substrate, wherein the bottom side of the first component, the bottom side of the package substrate, and a bottom side of the bonding material are coplanar at a bottom surface of the package.

16. The package of claim 12, wherein the opening comprises a recessed portion that partially extends through the package substrate from the top side of the package substrate.

17. The package of claim 12 is configured to handle a current range defined by a minimum current value and a maximum current value, the current range including 10 A.

18. A package comprising:
 a package substrate having a top side and a bottom side opposite the top side;
 an integrated device mounted over the top side of the package substrate;
 a component having a top side and a bottom side;
 means for positioning the bottom side of the component below the top side of the package substrate; and
 a molding compound that mechanically couples the component and the package substrate, the molding compound disposed over the top side of the package substrate and at least partially embedding the component,
 wherein a thickness of the component is greater than a thickness of the integrated device.

19. The package of claim 18, wherein the means for positioning comprises a through hole that extends through the package substrate, the component is at least partially disposed in the through hole.

20. The package of claim 18, wherein the means for positioning comprises a recessed portion, and the component is mounted on the recessed portion of the package substrate.

* * * * *